US006912146B2

(12) United States Patent
Gill et al.

(10) Patent No.: US 6,912,146 B2
(45) Date of Patent: Jun. 28, 2005

(54) USING AN MOS SELECT GATE FOR A PHASE CHANGE MEMORY

(75) Inventors: Manzur Gill, Cupertino, CA (US); Tyler Lowrey, San Jose, CA (US)

(73) Assignee: Ovonyx, Inc., Boise, ID (US)

( * ) Notice: Subject to any disclaimer, the term of this patent is extended or adjusted under 35 U.S.C. 154(b) by 298 days.

(21) Appl. No.: 10/318,705

(22) Filed: Dec. 13, 2002

(65) Prior Publication Data

US 2004/0113134 A1 Jun. 17, 2004

(51) Int. Cl.[7] .............................................. G11C 17/00
(52) U.S. Cl. ........................ 365/103; 365/63; 365/148; 365/225.7; 257/2; 257/20
(58) Field of Search .......................... 365/103, 63, 148, 365/225.7, 51, 163, 174; 257/2, 20, 5, 52; 438/660, 95, 96

(56) References Cited

U.S. PATENT DOCUMENTS

| 5,883,827 A | 3/1999 | Morgan |
| 6,314,014 B1 | 11/2001 | Lowrey et al. |
| 6,462,984 B1 * | 10/2002 | Xu et al. ..................... 365/175 |

FOREIGN PATENT DOCUMENTS

| EP | 1 326 254 A1 | 7/2003 |
| WO | WO 88/04096 | 6/1988 |

OTHER PUBLICATIONS

Hwang, Y.N., Hong, J.S., Lee, S.H., Ahn, S.J., Jeong, G.T., Koh, G.H., Kim, H.J., Jeong, W.C., Lee, S.Y., Park, J.H., Ryoo, K.C., Horii, H., Ha, Y.H., Yi, J.H., Cho, W.Y., Kim, Y.T., Lee, K.H., Joo, S.H., Park, S.O., Jeong, U.I., Jeong, H.S. and Kim, Kinam, "Completely CMOS–Compatible Phase–Change Nonvolatile RAM Using NMOS Cell Transistors," presented at 2003 19th IEEE Non–Volatile Semiconductor Memory Workshop, Monterey, California, Feb. 26–20, 2003.

Ha, Y.H., Yi, J.H., Horii, H., Park, J.H., Joo, S.H., Park, S.O., Chung, U–In and Moon, J.T., "An Edge Contact Type Cell for Phase Change RAM Featuring Very Low Power Consumption," presented at IEEE 2003 Symposium on VLSI Technology, Kyoto, Japan, Jun. 12–14, 2003.

Hwang, Y.N., Hong, J.S., Lee, S.H., Ahn, S.J., Jeong, G.T., Koh, G.H., Oh, J.H., Kim, H.J., Jeong, W.C., Lee, S.Y., Park, J.H., Ryoo, K.C., Horii, H., Ha, Y.H., Yi, J.H., Cho, W.Y., Kim, Y.T., Lee, K.H., Joo, S.H., Park, S.O., Chung, U.I., Jeong, H.S. and Kim, Kinam, "Full Integration and Reliability Evaluation of Phase–change RAM Based on 0.24 mm–CMOS Technologies," presented at IEEE 2003 Symposium on VLSI Technology, Kyoyo, Japan, Jun. 12–14, 2003.

Horii, H., Yi, J.H., Park, J.H., Ha, Y.H., Baek, I.G., Park, S.O., Hwang, Y.N., Lee, S.H., Kim, Y.T., Lee, K.H., Chung, U–In and Moon, J.T., "A Novel Cell Technology Using N–doped GeSbTe Films for Phase Change RAM," presented at IEEE 2003 Symposium on VLSI Technology, Kyoto, Japan, Jun. 12–14, 2003.

* cited by examiner

Primary Examiner—Steven Lake
Assistant Examiner—Thomas Magee
(74) Attorney, Agent, or Firm—Trop, Pruner & Hu, P.C.

(57) ABSTRACT

An NMOS field effect transistor may be utilized to drive the memory cell of a phase change memory. As a result, the leakage current may be reduced dramatically.

17 Claims, 1 Drawing Sheet

USING AN MOS SELECT GATE FOR A PHASE CHANGE MEMORY

BACKGROUND

This invention relates generally to electronic memories and particularly to electronic memories that use phase change material.

Phase change materials may exhibit at least two different states. The states may be called the amorphous and crystalline states. Transitions between these states may be selectively initiated. The states may be distinguished because the amorphous state generally exhibits higher resistivity than the crystalline state. The amorphous state involves a more disordered atomic structure. Generally any phase change material may be utilized. In some embodiments, however, thin-film chalcogenide alloy materials may be particularly suitable.

The phase change may be induced reversibly. Therefore, the memory may change from the amorphous to the crystalline state and may revert back to the amorphous state thereafter, or vice versa, in response to temperature changes. In effect, each memory cell may be thought of as a programmable resistor, which reversibly changes between higher and lower resistance states. The phase change may be induced by resistive heating.

Existing phase change memories have leakage currents. Thus, there is a need to reduce the leakage current of existing phase change memories.

DETAILED DESCRIPTION

Figure 1:
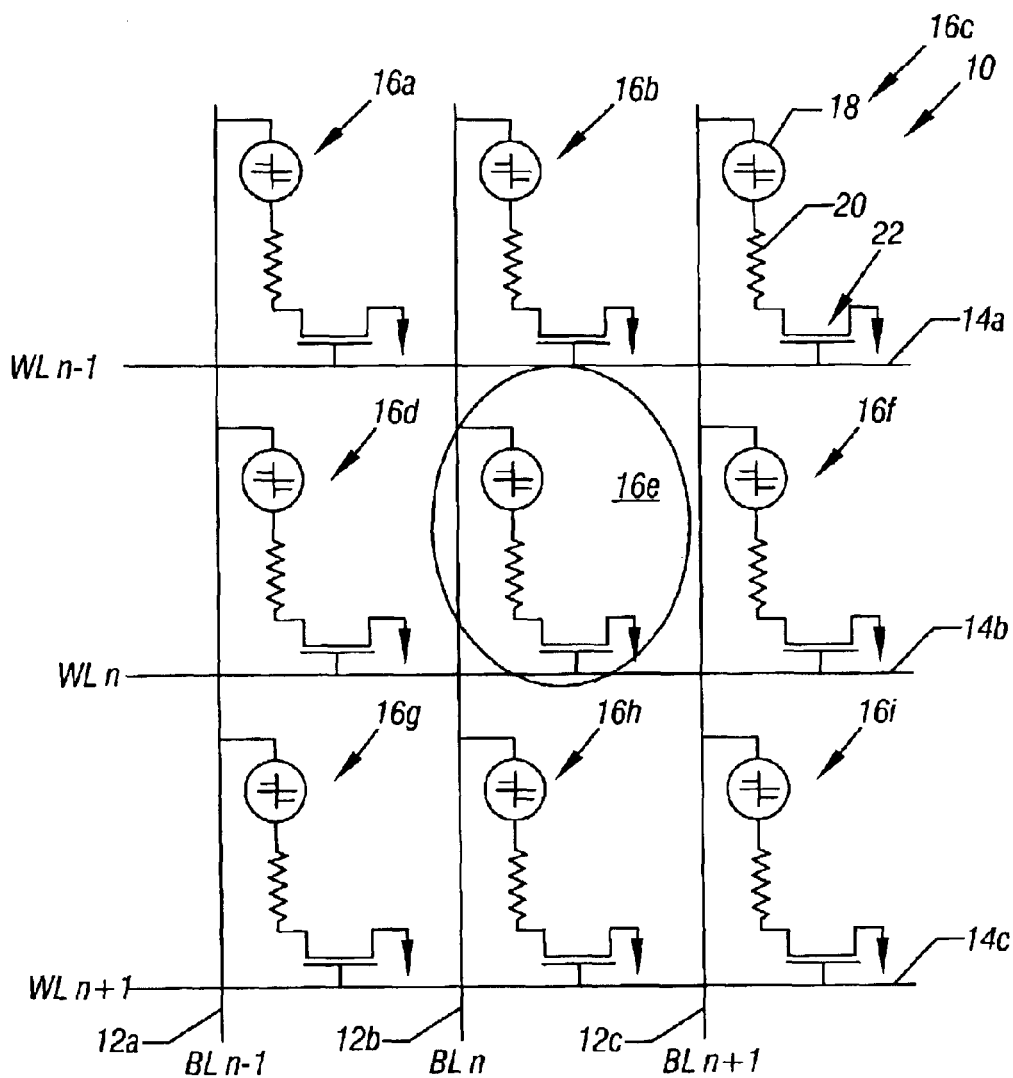
FIG. 1 is a schematic depiction of one embodiment of the present invention.
Figure 2:
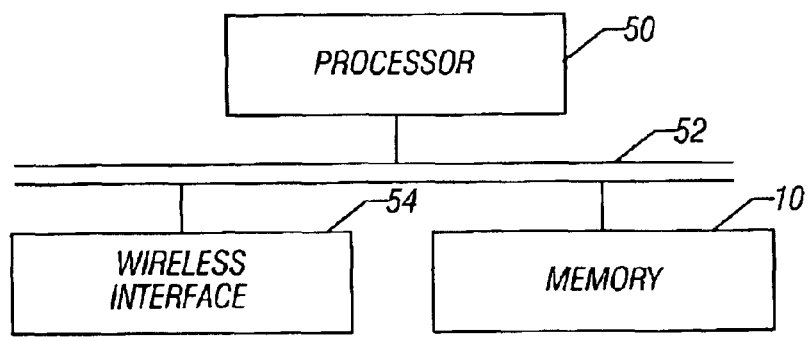
FIG. 2 is a system diagram of one embodiment of the present invention.

Referring to FIG. 1, a phase change memory array 10 may include a plurality of conductive lines or columns 12, including the columns 12a through 12c, and a plurality of rows 14 including the rows 14a through 14c. At the intersection of each row 14 and each column 12 is a memory element or memory cell 16.

Each cell 16 may include a phase change memory element 18, a resistor 20, and an n-type metal oxide semiconductor (NMOS) select gate 22. Examples of phase change memory material include, but are not limited to, chalcogenide element(s) compositions of the class of tellerium-germanium-antimony (TexGeySbz) material or GeSbTe alloys, although the scope of the present invention is not limited to just these. Alternatively, another phase change material may be used whose electrical properties (e.g., resistance, capacitance, etc.) may be changed through the application of energy such as, for example, light, heat, or electrical current. In this particular embodiment, chalcogenide layer 10 may have a thickness ranging from about 300 to 600 Å. When appropriate potential is applied to a conductive line such as a word line 14, the NMOS select gate 22 may be turned on, allowing a connection for current flow through a ground connection that includes the memory element 18. The memory element 18 may be coupled to a word line 12.

The phase change memory element 18 may be heated to a high temperature to amorphisize the material and reset the memory element (e.g., program 0). Heating the volume of memory material to a lower crystallization temperature crystallizes the material and sets the memory element (e.g., program 1). It is to be appreciated that the association of reset and set with amorphous and crystalline material, respectively, is a convention and that at least an opposite convention may be adopted. It is also to be appreciated from this example that the volume of memory material can be partially set or reset by varying the current flow and duration through the volume of memory material.

In the reset state when the phase change memory element 18 is in the amorphous or a less conductive state, the bitline 12b, which may be considered in this example the selected bitline, provides the reset current, and the bitlines 12a and 12c adjacent thereto have zero volts in one embodiment. At the same time, assuming the cell 16e is the selected cell, the word line 14b has the potential $V_{dd}$ and the adjacent word lines 14a and 14c have zero volts.

Similarly, in the set state, when the phase change material is in the more conductive state, the bitline 12b carries the set current while the adjacent bitlines 12a and 12c carry zero volts. The word line 14b with the selected cell 16e has the voltage $V_{dd}$ while the adjacent word lines 14a and 14c may be zero volts in one embodiment. The voltage $V_{dd}$ may be a supply voltage.

To read the memory cell, the read current occurs on the selected bitline 12b while the adjacent bitlines have zero volts. The selected word line 14b has the potential $V_{dd}$ and the adjacent word lines 14a and 14c have zero volts.

Thus, in one embodiment of the present invention, the memory array 10 has a dedicated ground. However, the biasing may be reversed, but in such case, the entire array 10 is biased.

The isolation between adjacent word lines along the adjacent bitlines 12 may be provided by a trench isolation or a polysilicon field plate isolation, as two examples. A source line runs parallel to each word line 14 and is shared between two adjacent word lines 14. Each source line may be contacted periodically every four, eight, or sixteen bits to the metal ground line, depending on how much voltage drop along the source line is acceptable.

Generally, the select device 22 current drive may match or exceed the reset current of the phase change memory cell 18.

However, the word lines 14 do not need metal straps because they generally do not carry large current in some embodiments. Generally, a single metal layer will be sufficient in some embodiments.

In some embodiments, a processor-based system may be implemented which includes a processor 50 coupled to a bus 52. The bus 52, in turn, may be coupled to the phase change memory 10 and a wireless interface 54 in one embodiment. The processor 50 may be a general purpose processor or a digital signal processor, to mention two examples.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A phase change memory comprising:
   a first conductive line;
   a memory element coupled to said first conductive line; and
   a second conductive line, said memory element coupled to said second conductive line through a metal oxide semiconductor field effect transistor.

2. The memory of claim 1 wherein said transistor is an NMOS transistor.

3. The memory of claim 1 wherein said first conductive line is a bitline.

4. The memory of claim 1 wherein said second conductive line is a word line.

5. The memory of claim 1 including a resistor in series with said element and said transistor.

6. The memory of claim 1 wherein said transistor is gate coupled to said second conductive line.

7. The memory of claim 6 wherein said transistor has a drain coupled to said element.

8. The memory of claim 1 wherein said transistor source is coupled to ground.

9. A method comprising:
coupling a phase change memory cell between a first and a second conductive line; and
coupling said first line to said cell through an MOS transistor.

10. The method of claim 9 including coupling said transistor to said second conductive line through the gate of said transistor.

11. The method of claim 10 including coupling said transistor source to ground.

12. The method of claim 11 including coupling said transistor to a word line.

13. The method of claim 12 including coupling said cell to a bitline.

14. The method of claim 10 including coupling said cell to an NMOS transistor.

15. A system comprising:
a digital signal processor;
a phase change memory coupled to said processor, said memory including a cell coupled to an MOS transistor;
a first conductive line coupled to said cell;
a second conductive line coupled to said cell; and
said MOS transistor coupled between said second conductive line and said phase change memory cell.

16. The system of claim 15 wherein said transistor is an NMOS transistor.

17. The system of claim 15 including a resistor in series with said memory and said transistor.

* * * * *